US012801022B2

(12) United States Patent
Tanaka et al.

(10) Patent No.: US 12,801,022 B2
(45) Date of Patent: Nov. 17, 2026

(54) INFORMATION PROCESSING APPARATUS, PATTERN FORMING APPARATUS, INFORMATION PROCESSING METHOD, AND ARTICLE MANUFACTURING METHOD

(71) Applicant: CANON KABUSHIKI KAISHA, Tokyo (JP)

(72) Inventors: Junya Tanaka, Tochigi (JP); Mitsuhide Nishimura, Tochigi (JP)

(73) Assignee: CANON KABUSHIKI KAISHA, Tokyo (JP)

(*) Notice: Subject to any disclaimer, the term of this patent is extended or adjusted under 35 U.S.C. 154(b) by 107 days.

(21) Appl. No.: 18/921,430

(22) Filed: Oct. 21, 2024

(65) Prior Publication Data

US 2025/0138427 A1 May 1, 2025

(30) Foreign Application Priority Data

Oct. 27, 2023 (JP) ................................ 2023-184676

(51) Int. Cl.
*G03F 7/20* (2006.01)
*H10P 72/00* (2026.01)
*H10P 72/30* (2026.01)
*H10P 72/50* (2026.01)
*H10P 72/76* (2026.01)
(Continued)

(52) U.S. Cl.
CPC ........ *G03F 7/2022* (2013.01); *H10P 72/0606* (2026.01); *H10P 72/0612* (2026.01); *H10P 72/32* (2026.01); *H10P 72/50* (2026.01); *H10P 72/7604* (2026.01); *H10P 74/203* (2026.01); *H10P 76/2041* (2026.01)

(58) Field of Classification Search
CPC ............... G03F 7/2022; G03F 7/70525; G03F 7/70725; G03F 7/70733; H10P 72/0606; H10P 72/0612; H10P 72/32; H10P 72/50; H10P 72/7604; H10P 74/203; H10P 76/2041; H10P 72/3302; H10P 72/7612
See application file for complete search history.

(56) References Cited

U.S. PATENT DOCUMENTS 6,784,974 B1 8/2004 Suzukawa
9,606,456 B2 * 3/2017 Ogura .................. G03F 9/7003
(Continued)

FOREIGN PATENT DOCUMENTS

JP 2001093817 A 4/2001

*Primary Examiner* — Hung V Nguyen
(74) *Attorney, Agent, or Firm* — ROSSI, KIMMS & McDOWELL LLP

(57) ABSTRACT

To provide an information processing apparatus capable of improving the throughput in a pattern forming apparatus as compared to the related art, the information processing apparatus is configured to perform a first determination step of determining, based on a state of holding a substrate by a substrate stage at a time of moving the substrate stage from a pattern forming position to a predetermined position in order to carry out the substrate in the pattern forming apparatus and a layout of a plurality of shot regions on the substrate, a last shot region in which a pattern is formed last when the pattern is formed in each of the plurality of shot regions, the predetermined position being a position at which the substrate held by the substrate stage is passed to a substrate conveyance unit.

18 Claims, 11 Drawing Sheets

(51) Int. Cl.
*H10P 74/20* (2026.01)
*H10P 76/20* (2026.01)

(56) References Cited

U.S. PATENT DOCUMENTS

| | | | | |
|---|---|---|---|---|
| 10,754,264 | B2 * | 8/2020 | Mase | G03F 9/7046 |
| 11,054,741 | B2 * | 7/2021 | Hirano | G03F 7/0002 |
| 11,327,411 | B2 * | 5/2022 | Nishimura | G03F 7/70691 |

* cited by examiner

INFORMATION PROCESSING APPARATUS, PATTERN FORMING APPARATUS, INFORMATION PROCESSING METHOD, AND ARTICLE MANUFACTURING METHOD

BACKGROUND OF THE INVENTION

Field of the Invention

The present invention relates to an information processing apparatus, a pattern forming apparatus, an information processing method, and a method of manufacturing an article.

Description of the Related Art

Hitherto, in a pattern forming apparatus for forming a pattern in each of a plurality of shot regions on a substrate, there is a demand for improvement of throughput by reducing time required for forming the pattern in each of the plurality of shot regions.

In Japanese Patent Application Laid-Open No. 2001-93817, there is disclosed an exposure apparatus in which the throughput is improved by reducing time required for moving between a plurality of sample shot regions at the time of alignment and moving from the sample shot region to a shot region at the time of starting exposure.

Meanwhile, there is known a pattern forming apparatus in which, after a pattern is formed in each of the plurality of shot regions on the substrate, the substrate is carried out in accordance with a conveyance method selected from a plurality of conveyance methods.

However, with such a pattern forming apparatus, time required for forming the pattern in each of the plurality of shot regions on the substrate is not reduced depending on the selected conveyance method, and the improvement of the throughput is insufficient.

SUMMARY OF THE INVENTION

In view of the above, the present invention has an object to provide an information processing apparatus capable of improving the throughput in a pattern forming apparatus as compared to the related art.

According to the present invention, there is provided an information processing apparatus configured to perform a first determination step of determining, based on a state of holding a substrate by a substrate stage at a time of moving the substrate stage from a pattern forming position to a predetermined position in order to carry out the substrate in a pattern forming apparatus and a layout of a plurality of shot regions on the substrate, a last shot region in which a pattern is formed last when the pattern is formed in each of the plurality of shot regions, the predetermined position being a position at which the substrate held by the substrate stage is passed to a substrate conveyance unit.

Further features of the present invention will become apparent from the following description of exemplary embodiments with reference to the attached drawings.

DESCRIPTION OF THE EMBODIMENTS

Figure 1A:
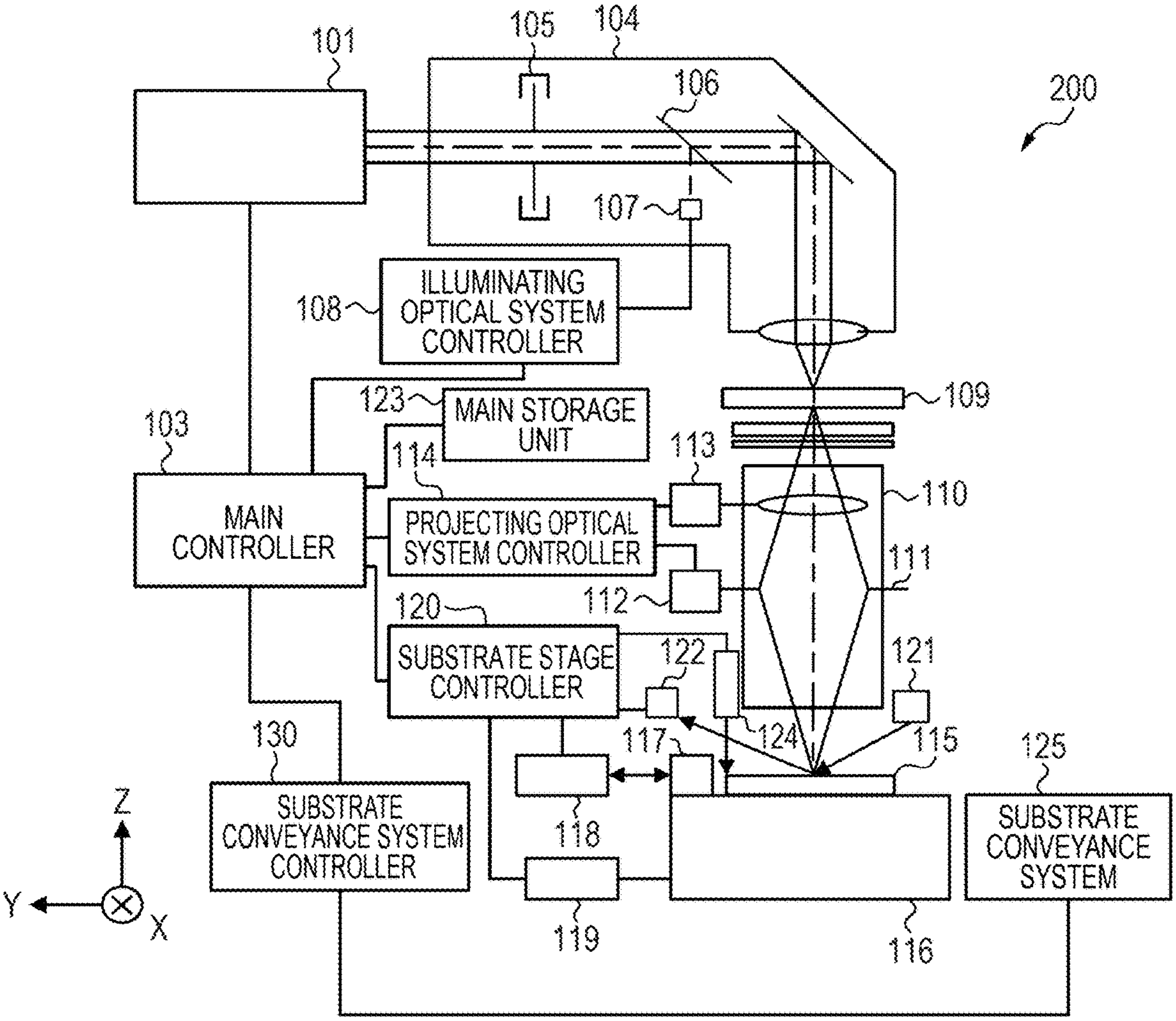
FIG. 1A is a schematic cross-sectional view of an exposure apparatus including an information processing apparatus according to the present invention.

Now, an information processing apparatus according to the present invention is described in detail with reference to the accompanying drawings. The drawings to be referred to below may be drawn on a scale different from the actual scale in order to facilitate understanding of the present invention.

Further, in the following, a direction that is parallel to an optical axis of a projecting optical system 110 (direction perpendicular to a substrate surface of a substrate 115) is defined as a Z direction, and two directions that are orthogonal to each other within a plane perpendicular to the Z direction (plane parallel to the substrate surface of the substrate 115) are defined as an X direction and a Y direction.

Further, it is assumed that each numerical value represented below is stored in a main storage unit 123 or an alternative thereof.

Further, an embodiment described below is an example of a measure for achieving an information processing apparatus according to the present invention, and can be modified or changed as appropriate.

Further, the information processing apparatus according to the present invention is applicable to not only an exposure apparatus described below, but also to, for example, a precision processing apparatus or a precision measuring apparatus.

In recent years, along with diversification of a method (process) of manufacturing a device, there is a demand for processing a wide variety of substrates with high productivity.

Examples of the wide variety of substrates referred to here include a substrate having a large warpage and a substrate having a low flatness.

In addition, there is known an exposure apparatus having, in order to convey such wide variety of substrates, a plurality of methods of conveying the substrates.

For example, there is known an exposure apparatus capable of changing a method of conveying a substrate depending on a substrate sucking pressure or an alignment measurement value.

Meanwhile, there is known an exposure apparatus in which throughput is improved by reducing time required for exposure with respect to each of a plurality of shot regions on a substrate.

For example, there is known an exposure apparatus in which an order to process each of the plurality of shot regions is determined so that a movement distance between the shot regions is reduced.

Further, there is known an exposure apparatus in which an order to perform exposure with respect to each of the plurality of shot regions is determined based on a positional relationship between an optical path of exposure light and the shot region.

As described above, there is known an exposure apparatus capable of changing the method of conveying the substrate and an exposure apparatus that determines an exposure order with respect to each of the plurality of shot regions provided in the substrate.

However, an exposure apparatus that determines the exposure order with respect to each of the plurality of shot regions provided in the substrate depending on the method of conveying the substrate is not known.

In view of the above, the present invention has an object to provide an information processing apparatus that determines, depending on a method of conveying a substrate, an order to form a pattern in each of a plurality of shot regions provided in the substrate.

FIG. 1A shows a schematic cross-sectional view of an exposure apparatus 200 including an information processing apparatus according to one embodiment of the present invention.

The exposure apparatus 200 includes a light source 101, a main controller 103, an illuminating optical system 104, an illuminating optical system controller 108, the projecting optical system 110, and a projecting optical system controller 114.

The exposure apparatus 200 further includes a substrate stage 116, a substrate stage controller 120, the main storage unit 123, a substrate conveyance system 125, and a substrate conveyance system controller 130.

The information processing apparatus according to the present embodiment is formed of the main controller 103 and the main storage unit 123.

The light source 101 can select a predetermined wavelength from a plurality of wavelength bands, and can emit exposure light having the predetermined wavelength.

The exposure light emitted from the light source 101 is shaped into a predetermined shape by a shaping optical system (not shown) provided in the illuminating optical system 104.

Next, the shaped exposure light is incident on an optical integrator (not shown) provided in the illuminating optical system 104 so as to form a large number of secondary light sources for illuminating an original 109 with a uniform illuminance distribution.

Further, the illuminating optical system 104 includes a light shielding plate 105. When the exposure light passes through the light shielding plate 105, an illumination region of any size can be formed on the original 109.

Further, the illuminating optical system 104 includes a half mirror 106. When the exposure light is incident on the half mirror 106, part of the exposure light is reflected to be extracted.

In addition, the exposure light reflected by the half mirror 106 is incident on a photosensor 107. Thus, the photosensor 107 performs output in accordance with an intensity (exposure energy) of the incident exposure light.

The original 109 (mask) has, for example, a pattern of a circuit of a semiconductor device formed thereon in order to transfer the pattern onto the substrate 115. The original 109 is illuminated with the exposure light that has passed through the illuminating optical system 104.

The projecting optical system 110 is arranged so that the image of the pattern formed on the original 109 is reduced by a reduction magnification "β" (for example, "β" is ½), and the reduced image is imaged and projected in a predetermined shot region on the substrate 115 to which a photosensitive agent is applied.

An optical system of a refractive type, a catadioptric type, or other types can be used as the projecting optical system 110.

Further, an aperture stop 111 having a substantially circular aperture portion is provided on a pupil surface of the projecting optical system 110, that is, on a Fourier-transformed surface with respect to the original 109.

In addition, a diameter of the aperture portion of the aperture stop 111 can be adjusted to have a desired value by a driving device 112 such as a motor.

Further, a part of a plurality of optical elements provided in the projecting optical system 110 can be moved on the optical axis of the projecting optical system 110 by a driving device 113.

In this manner, various aberrations of the projecting optical system 110 are reduced, and the distortion error is reduced by improving the projection magnification.

In addition, the driving device 112 and the driving device 113 described above are controlled by the projecting optical system controller 114 under control of the main controller 103.

The substrate stage 116 is configured to be movable in each of the X direction, the Y direction, and the Z direction, that is, to be three-dimensionally movable.

In addition, a laser interferometer 118 measures a distance between the laser interferometer 118 and a reflecting mirror 117 fixed on the substrate stage 116 so as to detect a position within an XY plane of the substrate stage 116.

An alignment measurement system 124 measures a deviation between a position within the XY plane of the substrate 115 and a position within the XY plane of the substrate stage 116.

In addition, under control of the main controller 103, the substrate stage controller 120 controls a driving device 119 such as a motor based on the measurement results obtained by the alignment measurement system 124 so as to move the substrate stage 116 to a predetermined position within the XY plane.

A light projecting optical system 121 and a detecting optical system 122 form a focus surface detecting unit for measuring a position in the Z direction of the substrate 115.

Specifically, the light projecting optical system 121 projects, to the photosensitive agent applied to the substrate 115, a plurality of light fluxes that are each non-exposure light that does not cause sensing by the photosensitive agent.

In addition, each of a plurality of reflected light fluxes generated when each of the plurality of light fluxes is reflected on the substrate 115 is incident on the detecting optical system 122.

The detecting optical system 122 includes a light receiving element for receiving the plurality of incident reflected light fluxes, and an imaging optical system for guiding the plurality of incident reflected light fluxes to the light receiving element.

Further, a light receiving surface of the light receiving element and a reflection point of each of the plurality of light fluxes that have been incident on the substrate 115 are substantially optically conjugate with each other via the imaging optical system.

In addition, positional deviation in the Z direction of the substrate surface of the substrate 115 can be measured from deviation of an incident position of each of the plurality of reflected light fluxes on the light receiving surface of the light receiving element provided in the detecting optical system 122.

The main controller 103 may be formed of, for example, a computer (information processing apparatus) including a calculation unit 103*a* including a processor such as a CPU and the main storage unit 123 including a memory or the like.

The main storage unit 123 stores information for determining a conveyance method and an exposure method for the substrate 115, including an exposure amount and a layout of a plurality of shot regions in the substrate 115.

In addition, the main controller 103 controls, based on each piece of information stored in the main storage unit 123, a plurality of sub-controllers including the substrate conveyance system controller 130 for controlling the substrate conveyance system 125 for conveying the substrate 115.

Figure 1B:
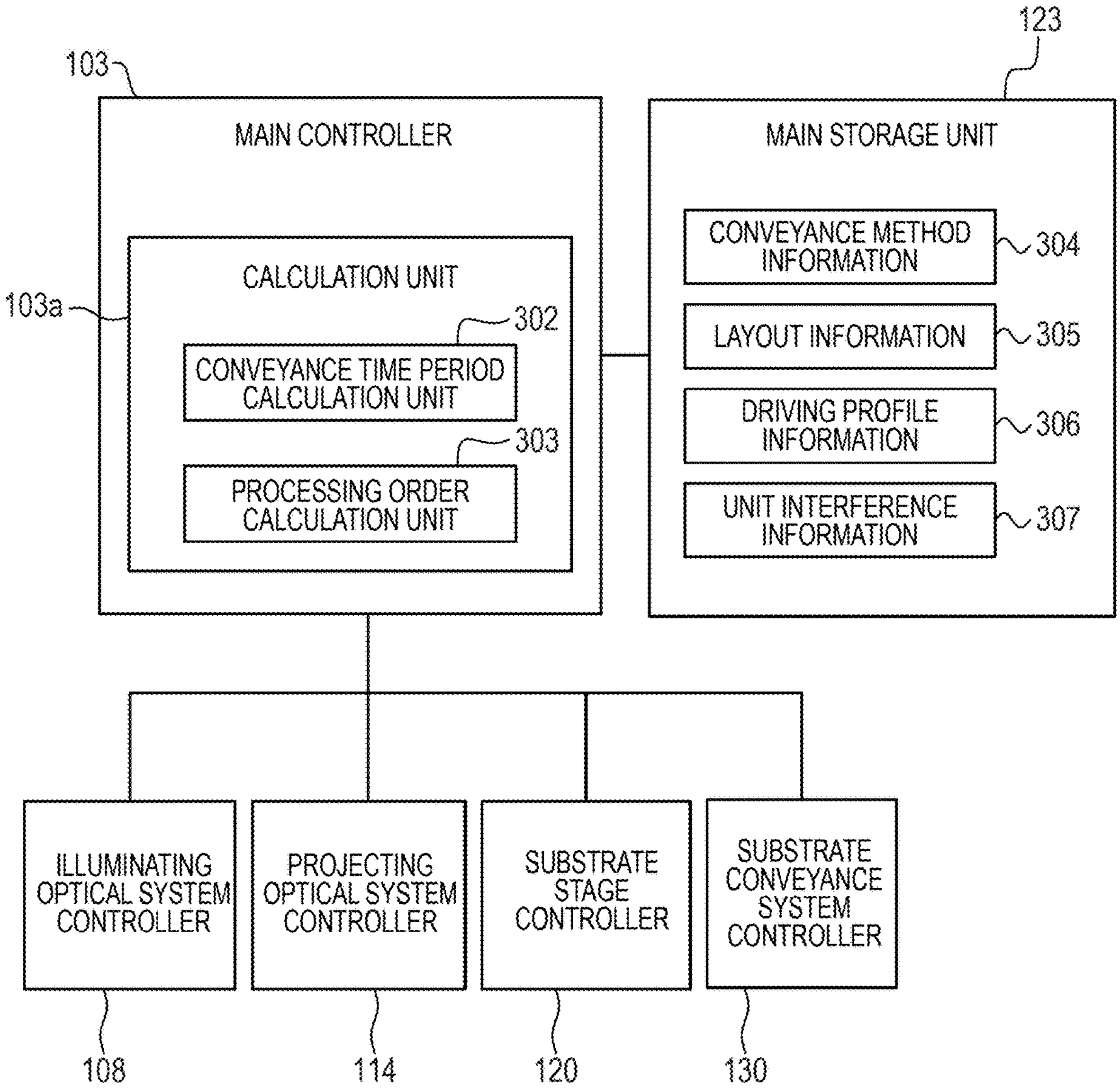
FIG. 1B is a partial block diagram of the exposure apparatus including the information processing apparatus according to the present invention.

FIG. 1B shows a block diagram of the main controller 103, each sub-controller, and the main storage unit 123 provided in the exposure apparatus 200.

As illustrated in FIG. 1B, the main controller 103 includes the calculation unit 103*a* including a conveyance time period calculation unit 302 and a processing order calculation unit 303.

The conveyance time period calculation unit 302 calculates, in Step S307 to be described later, a conveyance time period of the substrate 115 from coordinates at the time of performing exposure with respect to a predetermined shot region to coordinates of a substrate carrying-out position 208.

The processing order calculation unit 303 determines, in Step S311 to be described later, an order to perform exposure with respect to each of a plurality of shot regions provided in the substrate 115.

Further, the processing order calculation unit 303 determines, in Step S314 to be described later, an order to perform processing with respect to each of a plurality of sample shot regions provided in the substrate 115.

Further, as illustrated in FIG. 1B, the main storage unit 123 stores conveyance method information 304 and layout information 305 which are acquired in Step S301 and Step S302 to be described later, respectively.

Further, the main storage unit 123 stores driving profile information 306 and unit interference information 307 which are acquired in Step S303 and Step S304 to be described later, respectively.

Figure 2:
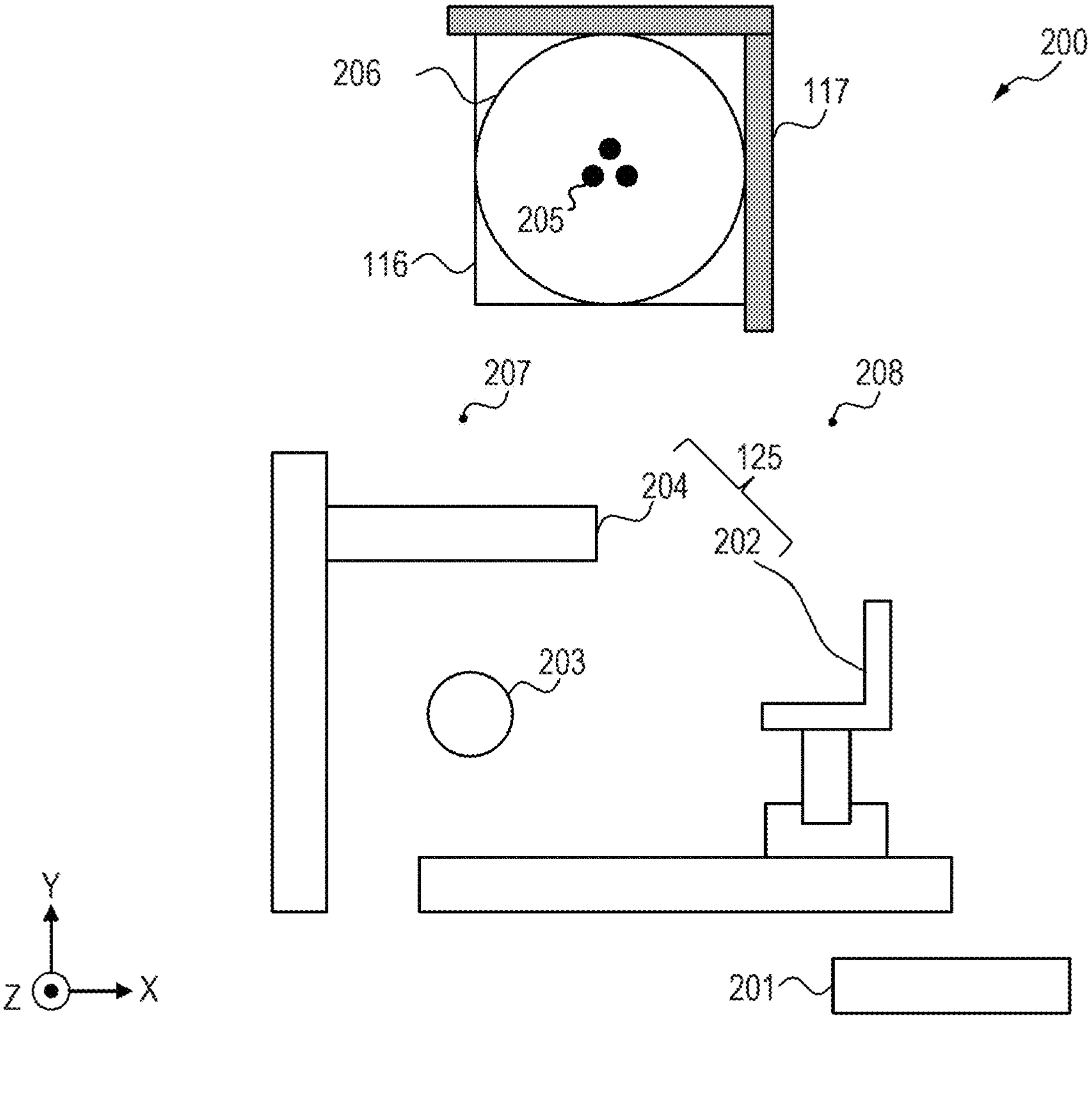
FIG. 2 is a schematic top view in the vicinity of a substrate conveyance system of the exposure apparatus.

FIG. 2 shows a schematic top view in the vicinity of the substrate conveyance system 125 of the exposure apparatus 200.

As illustrated in FIG. 2, the substrate conveyance system 125 includes a first substrate conveyance unit 202 and a second substrate conveyance unit 204.

In addition, the first substrate conveyance unit 202 and the second substrate conveyance unit 204 may each include a substrate holding unit for holding the substrate 115, and a driving unit for driving the substrate holding unit.

In the substrate conveyance system 125, for example, the substrate 115 is carried in through an entrance 201 connected to an external apparatus provided in a device manufacturing factory.

Next, the carried-in substrate 115 is conveyed by the first substrate conveyance unit 202 to a pre-alignment unit 203 for performing pre-alignment of the substrate 115.

In addition, the substrate 115 subjected to pre-alignment in the pre-alignment unit 203 is conveyed by the second substrate conveyance unit 204 to a substrate carrying-in position 207, and is then mounted onto the substrate stage 116.

At this time, the substrate stage 116 is moved in advance to the substrate carrying-in position 207.

Specifically, at the substrate carrying-in position 207, the substrate 115 is received by pins 205, and then is passed from the pins 205 to a chuck 206 to be mounted onto the chuck 206.

In each of the first substrate conveyance unit 202, the pre-alignment unit 203, the second substrate conveyance unit 204, the pins 205, and the chuck 206, the substrate 115 is held by, for example, vacuum suction.

When the substrate 115 is mounted onto the chuck 206 as described above, the processing of carrying in the substrate 115 is completed.

Next, after the substrate stage 116 having the substrate 115 mounted thereon is moved to an exposure position (pattern forming position), exposure processing (pattern formation processing) is performed on the substrate 115 at the exposure position.

After the exposure processing is ended, the substrate stage 116 having the substrate 115 mounted thereon is moved to the substrate carrying-out position 208.

In addition, at the substrate carrying-out position 208, after the substrate 115 is passed from the substrate stage 116 to the first substrate conveyance unit 202, the first substrate conveyance unit 202 conveys the substrate 115 to the entrance 201. Thus, the processing of carrying out the substrate 115 is completed.

Here, when the substrate 115 is carried out from the exposure position to the entrance 201 as described above, parallel drive or sequential drive as described below is performed.

Figure 3:
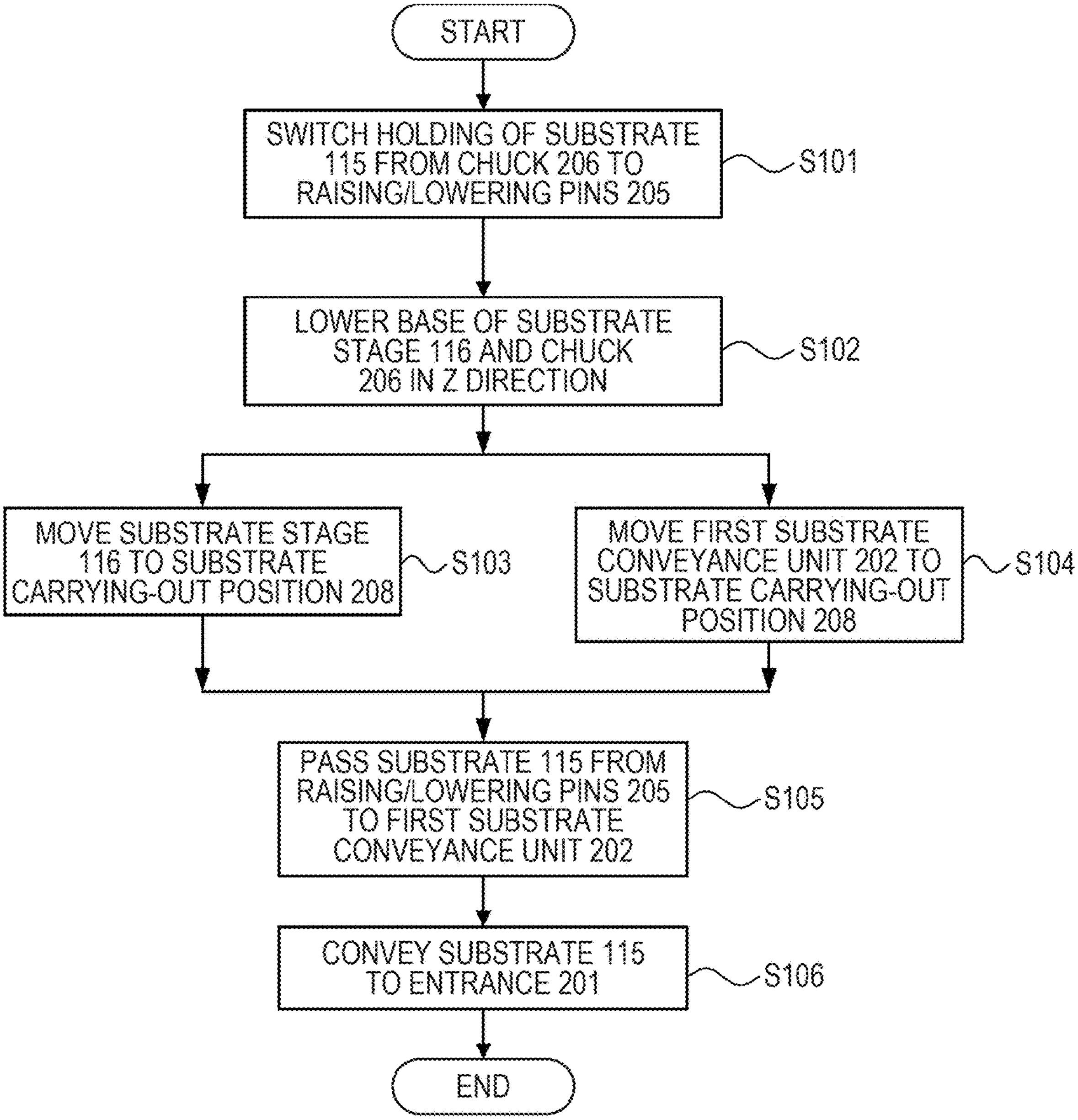
FIG. 3 is a flow chart for illustrating processing of carrying out a substrate from an exposure position to an entrance by parallel drive.

FIG. 3 shows a flow chart for illustrating processing of carrying out the substrate 115 from the exposure position to the entrance 201 by parallel drive.

Figure 4A:
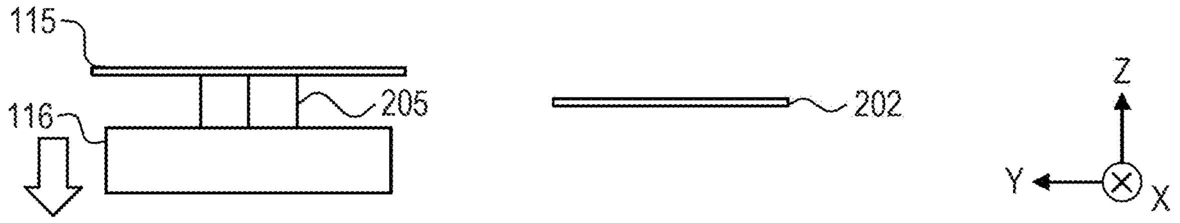
FIG. 4A is a side view of each of a substrate stage and a first substrate conveyance unit at a certain timing in the processing of FIG. 3.
Figure 4B:
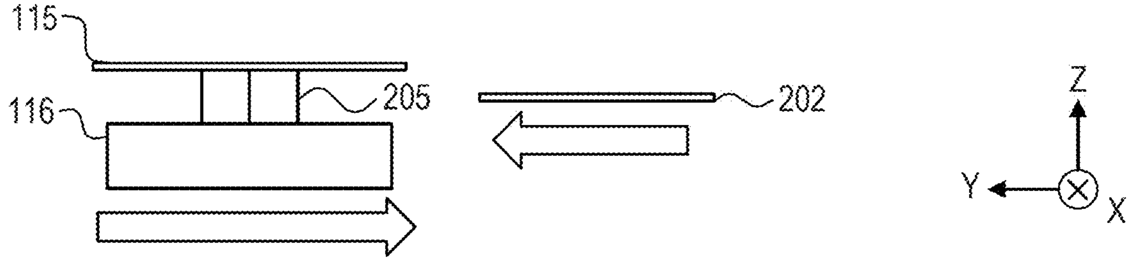
FIG. 4B is a side view of each of the substrate stage and the first substrate conveyance unit at another timing in the processing of FIG. 3.
Figure 4C:
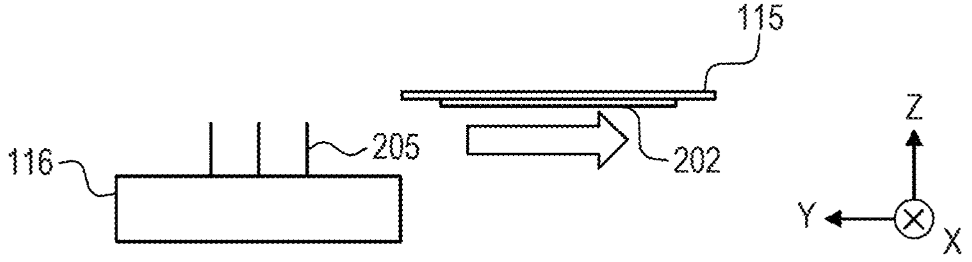
FIG. 4C is a side view of each of the substrate stage and the first substrate conveyance unit at further another timing in the processing of FIG. 3.

Further, each of FIG. 4A, FIG. 4B, and FIG. 4C shows a side view of each of the substrate stage 116 and the first substrate conveyance unit 202 at each timing in the carrying-out processing illustrated in FIG. 3.

First, when this processing is started, the switching of holding is performed so that the substrate 115 that has been held by the chuck 206 on the substrate stage 116 is held by the pins 205 (Step S101).

Next, a base of the substrate stage 116 and the chuck 206 are lowered in the Z direction (Step S102).

In this manner, as illustrated in FIG. 4A, the pins 205 are relatively raised in the Z direction so that a gap is formed between the substrate 115 and each of the base of the substrate stage 116 and the chuck 206.

This gap is only required to have a size that does not cause interference when the first substrate conveyance unit 202 is moved to a position within the XY plane at which the substrate stage 116 is arranged.

Next, as illustrated in FIG. 4B, the substrate stage 116 is moved to the substrate carrying-out position 208 (Step S103), and, in parallel thereto, the first substrate conveyance unit 202 is also moved to the substrate carrying-out position 208 (Step S104).

When both of Step S103 and Step S104 are ended, the substrate 115 is passed from the pins 205 to the first substrate conveyance unit 202 (Step S105).

Then, as illustrated in FIG. 4C, the first substrate conveyance unit 202 conveys the substrate 115 to the entrance 201 (Step S106), and the processing is ended.

As described above, at the time of carrying out the substrate 115 from the exposure position to the entrance 201 while the substrate stage 116 and the first substrate conveyance unit 202 are driven in parallel to each other, Step S103 and Step S104 are performed as processes parallel to each other so that the carrying-out time period can be reduced.

In the conveyance of FIG. 3, the substrate stage 116 is moved to the substrate carrying-out position 208 while the substrate 115 is held by the pins 205, and hence this conveyance can also be referred to as "pin conveyance" (first conveyance).

Figure 5:
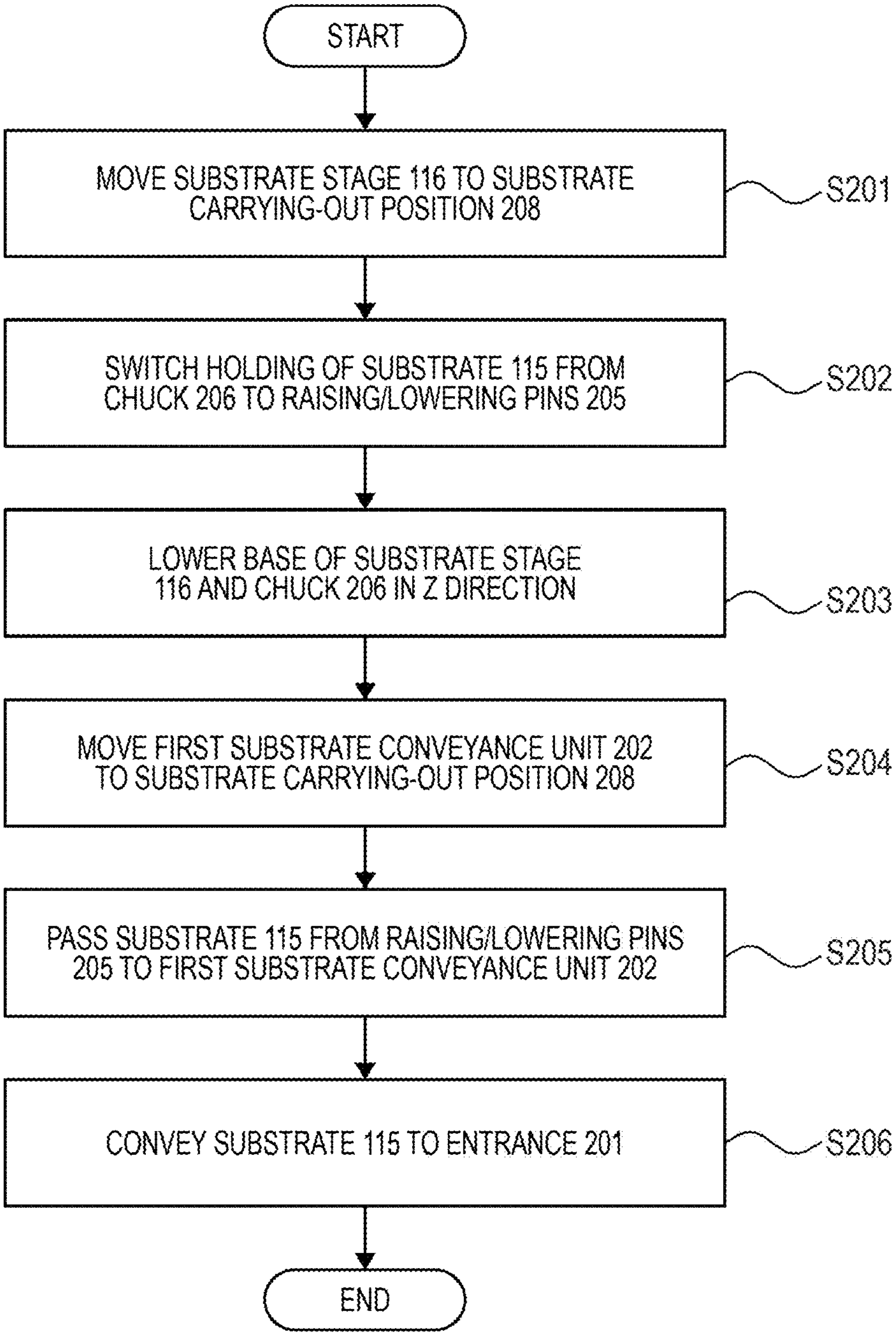
FIG. 5 is a flow chart for illustrating processing of carrying out the substrate from the exposure position to the entrance by sequential drive.

FIG. 5 shows a flow chart for illustrating processing of carrying out the substrate 115 from the exposure position to the entrance 201 by sequential drive.

Further, each of FIG. 6A, FIG. 6B, FIG. 6C, and FIG. 6D shows a side view of each of the substrate stage 116 and the first substrate conveyance unit 202 at each timing in the carrying-out processing illustrated in FIG. 5.

Figure 6A:
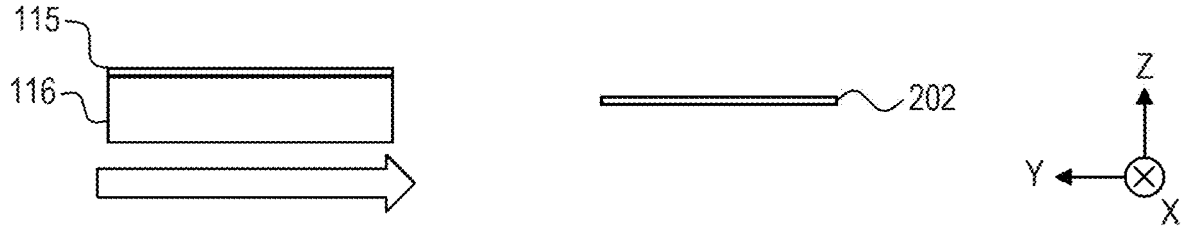
FIG. 6A is a side view of each of the substrate stage and the first substrate conveyance unit at a certain timing in the processing of FIG. 5.

First, when this processing is started, as illustrated in FIG. 6A, the substrate stage 116 is moved to the substrate carrying-out position 208 while the substrate 115 is held by the chuck 206 (Step S201).

In this manner, the conveyance time period of the substrate 115 can be reduced by improving a driving profile of the substrate stage 116.

Next, the switching of holding is performed so that the substrate 115 that has been held by the chuck 206 on the substrate stage 116 is held by the pins 205 (Step S202).

Then, the base of the substrate stage 116 and the chuck 206 are lowered in the Z direction (Step S203).

Figure 6B:
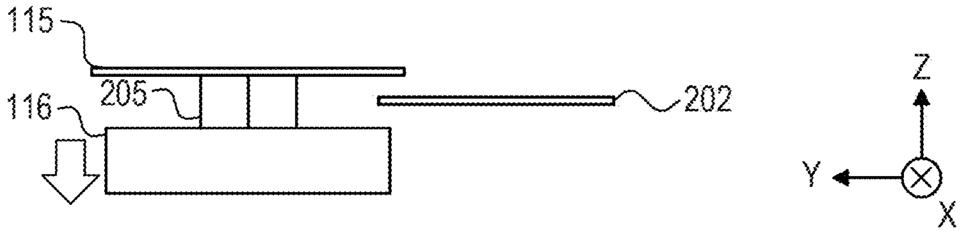
FIG. 6B is a side view of each of the substrate stage and the first substrate conveyance unit at another timing in the processing of FIG. 5.

In this manner, as illustrated in FIG. 6B, the pins 205 are relatively raised in the Z direction so that a gap is formed between the substrate 115 and each of the base of the substrate stage 116 and the chuck 206.

This gap is only required to have a size that does not cause interference with the substrate stage 116 when the first substrate conveyance unit 202 is moved to the substrate carrying-out position 208.

Figure 6C:
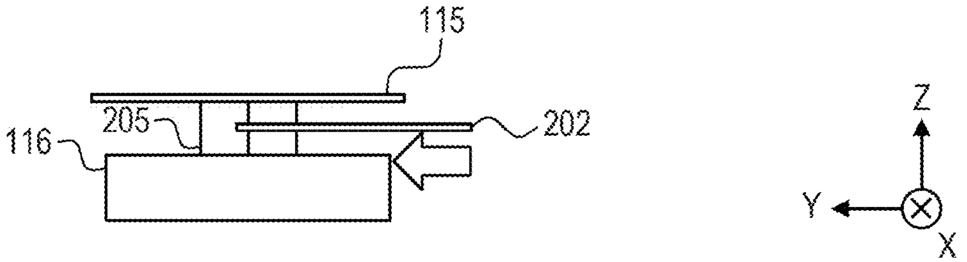
FIG. 6C is a side view of each of the substrate stage and the first substrate conveyance unit at further another timing in the processing of FIG. 5.

Next, as illustrated in FIG. 6C, the first substrate conveyance unit 202 is moved to the substrate carrying-out position 208 (Step S204), and the substrate 115 is passed from the pins 205 to the first substrate conveyance unit 202 (Step S205).

Figure 6D:
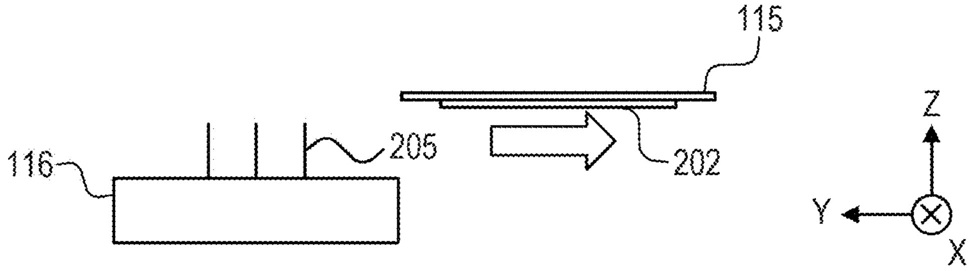
FIG. 6D is a side view of each of the substrate stage and the first substrate conveyance unit at yet further another timing in the processing of FIG. 5.

Then, as illustrated in FIG. 6D, the first substrate conveyance unit 202 conveys the substrate 115 to the entrance 201 (Step S206), and the processing is ended.

As described above, at the time of carrying out the substrate 115 from the exposure position to the entrance 201 while the substrate stage 116 and the first substrate conveyance unit 202 are sequentially driven, Step S201 and Step S204 are sequentially performed.

In the conveyance of FIG. 5, the substrate stage 116 is moved to the substrate carrying-out position 208 while the substrate 115 is held by the chuck 206, and hence this conveyance can also be referred to as "chuck conveyance" (second conveyance).

As described later, in the information processing apparatus according to the present embodiment, an order to perform exposure with respect to the plurality of shot regions and an order to perform processing with respect to the plurality of sample shot regions in the substrate 115 are determined depending on one conveyance method selected from the pin conveyance and the chuck conveyance described above.

In this manner, the time period of the processing of conveying the substrate 115 can be reduced.

At this time, in the pin conveyance in which the parallel drive is performed, there is a fear of interference between the substrate stage 116 and the first substrate conveyance unit 202. Meanwhile, in the chuck conveyance in which the sequential drive is performed, there is no fear of the interference.

Figure 7:
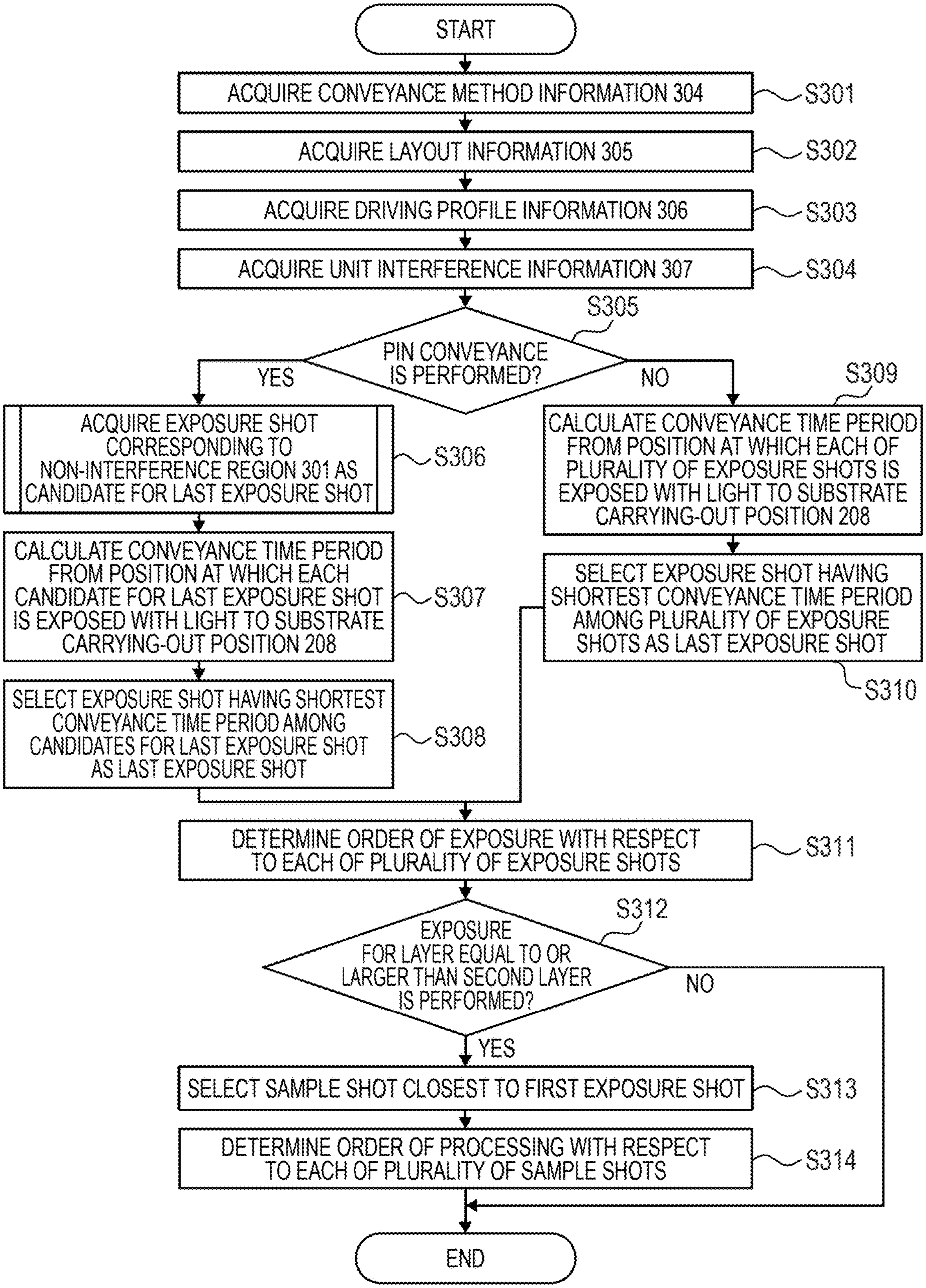
FIG. 7 is a flow chart for illustrating processing of determining an order of exposure with respect to each of a plurality of shot regions in the information processing apparatus according to the present invention.

FIG. 7 shows a flow chart for illustrating processing of determining the order to perform exposure with respect to the plurality of shot regions and the order to perform processing with respect to the plurality of sample shot regions in the substrate 115 in the information processing apparatus according to the present embodiment.

First, when this processing is started, the main controller 103 acquires the conveyance method information 304 about the method of conveying the substrate 115 (Step S301).

Specifically, the conveyance method information 304 acquired in Step S301 includes information about whether the substrate 115 is conveyed by chuck conveyance or pin conveyance when the substrate stage 116 is moved from the exposure position to the substrate carrying-out position 208.

Next, the main controller 103 acquires the layout information 305 about the layout of the substrate 115 (Step S302).

Specifically, the layout information 305 acquired in Step S302 includes information about the layout of the plurality of shot regions in the substrate 115.

Further, the layout information 305 also includes information about the layout of the plurality of sample shot regions in which measurement for alignment processing, specifically, global alignment is performed.

Figure 9A:
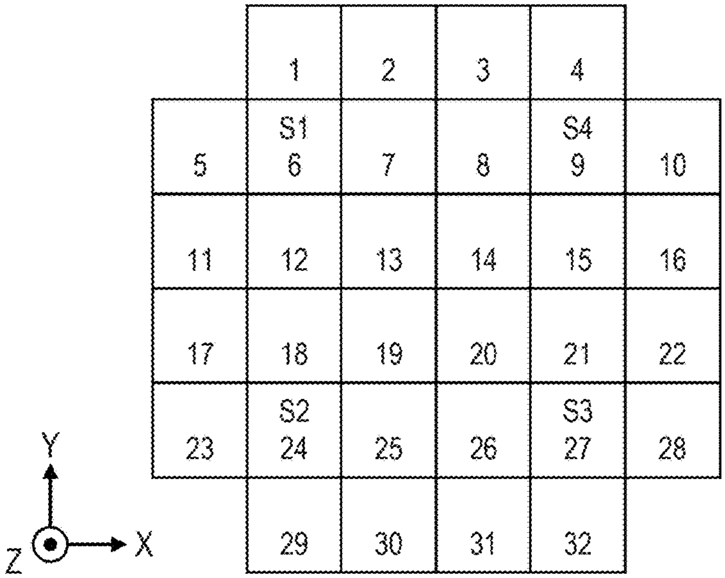
FIG. 9A is a view for illustrating an example of a layout of the plurality of shot regions and a plurality of sample shot regions in the substrate.

FIG. 9A shows an example of the layout of the plurality of shot regions and the plurality of sample shot regions.

In the example illustrated in FIG. 9A, thirty-two shot regions 1 to 32 and four sample shot regions S1 to S4 are provided on the substrate 115.

It is to be noted that the numbers 1 to 32 of the respective shot regions and the numbers S1 to S4 of the respective sample shot regions illustrated in FIG. 9A are each not a number representing the order of the processing, but are each a tentative number for distinction from each other.

Next, the main controller 103 acquires the driving profile information 306 about the movement of the substrate stage 116 (Step S303).

Specifically, the driving profile information 306 acquired in Step S303 includes time changes of the speed, the acceleration, and the jerk of the substrate stage 116 from when the substrate 115 is carried in through the entrance 201 to when the substrate 115 is carried out through the entrance 201.

Next, the main controller 103 acquires the unit interference information 307 about interference in the movement of the substrate stage 116 (Step S304).

Specifically, the unit interference information 307 includes information about interference between the first substrate conveyance unit 202 and the pins 205 or the reflecting mirror 117 in the substrate stage 116 when the substrate stage 116 is moved from the exposure position to the substrate carrying-out position 208.

More specifically, the information about the interference includes information about a non-interference region 301 regarding a movement start position at the time of moving the substrate stage 116 from the exposure position to the substrate carrying-out position 208.

Figure 10:
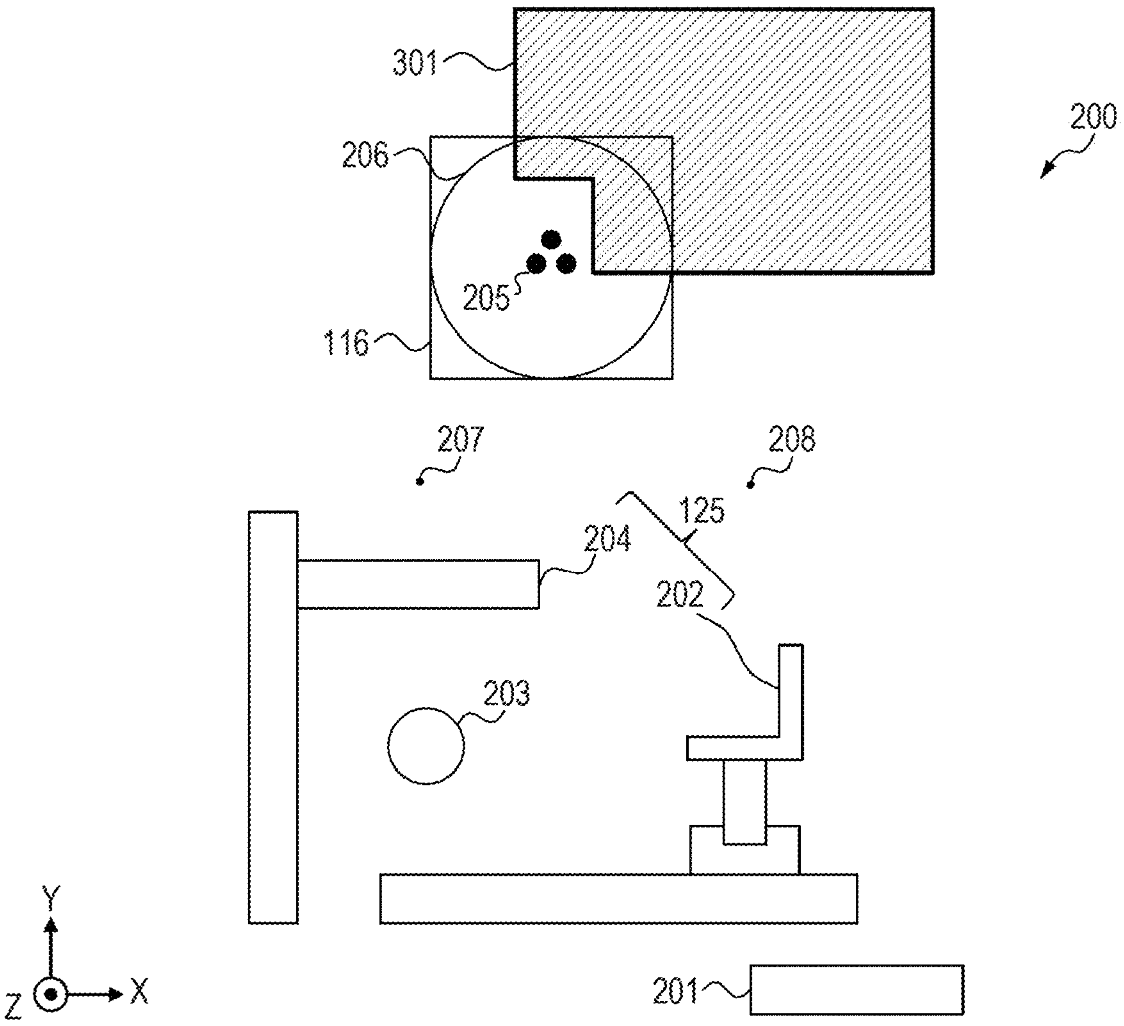
FIG. 10 is a schematic top view in the vicinity of the substrate conveyance system of the exposure apparatus, for illustrating an example of the non-interference region.

FIG. 10 shows a schematic top view in the vicinity of the substrate conveyance system 125 of the exposure apparatus 200, for illustrating an example of the non-interference region 301 included in the unit interference information 307.

When the substrate 115 is conveyed from the exposure position to the substrate carrying-out position 208 by pin conveyance, there is a possibility that the first substrate conveyance unit 202 and the pins 205 or the reflecting mirror 117 provided in the substrate stage 116 interfere with each other.

Accordingly, the non-interference region 301 can be determined based on movement profiles and the like of both of the substrate stage 116 and the first substrate conveyance unit 202 at the time of moving each of the substrate stage 116 and the first substrate conveyance unit 202 to the substrate carrying-out position 208.

That is, the non-interference region 301 is determined based on an exposure position at which the substrate stage 116 and the first substrate conveyance unit 202 do not interfere with each other when both of the substrate stage 116 and the first substrate conveyance unit 202 are moved to the substrate carrying-out position 208 in parallel to each other, in other words, the movement start position of the substrate stage 116 to the substrate carrying-out position 208.

Next, the main controller 103 determines whether the substrate 115 is conveyed by pin conveyance when the substrate stage 116 is moved from the exposure position to the substrate carrying-out position 208, based on the conveyance method information 304 acquired in Step S101 (Step S305).

When the substrate 115 is conveyed by pin conveyance when the substrate stage 116 is moved from the exposure position to the substrate carrying-out position 208 (Yes in Step S305), the process proceeds to Step S306.

In Step S306, the main controller 103 acquires a shot region corresponding to the non-interference region 301 included in the unit interference information 307 as a candidate for a last shot region, based on the layout of the plurality of shot regions in the substrate 115 included in the layout information 305.

Figure 8:
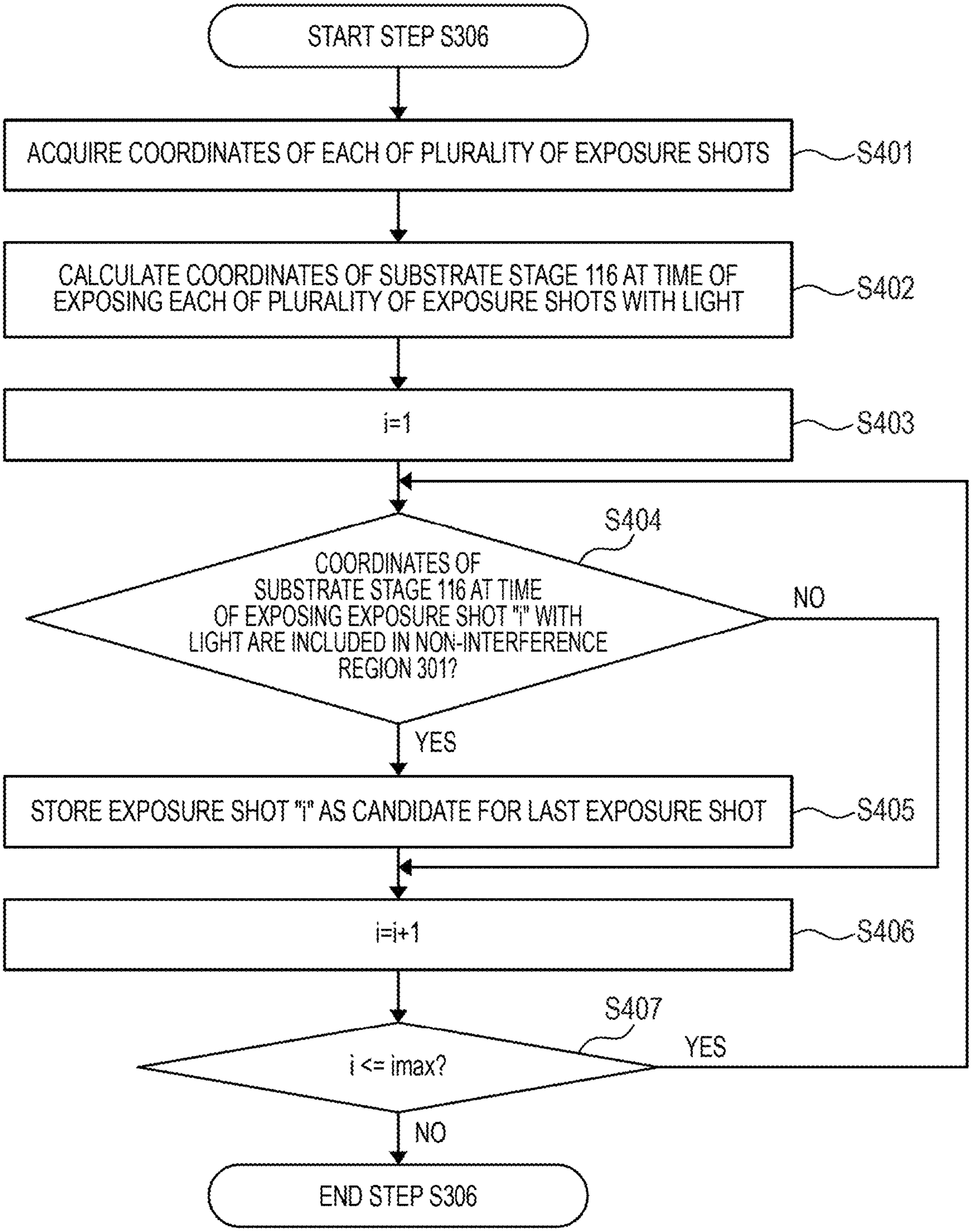
FIG. 8 is a sub-flow chart for illustrating processing of acquiring a shot region corresponding to a non-interference region in Step S306.

FIG. 8 shows a sub-flow chart for illustrating processing (extraction step) of acquiring (extracting) a shot region corresponding to the non-interference region 301 as the candidate for the last shot region in Step S306.

First, when this processing is started, the main controller 103 acquires coordinates within the XY plane of each of the plurality of shot regions in the substrate 115 (Step S401).

In this case, the coordinates within the XY plane of each of the plurality of shot regions are acquired through use of coordinates of a center of the substrate 115 as reference coordinates.

Next, the main controller 103 calculates coordinates within the XY plane of the substrate stage 116 at the time of performing exposure with respect to each of the plurality of shot regions (Step S402).

In this case, coordinates within the XY plane of the optical axis of the projecting optical system 110 are used as reference coordinates of the substrate stage 116.

At this time, in Step S402, the coordinates within the XY plane of the substrate stage 116 at the time of exposing a predetermined shot region with light can be calculated as coordinates acquired by reversing signs of the coordinates within the XY plane of the predetermined shot region.

Next, the main controller 103 sets a variable "i" indicating the number of the shot region to 1 (Step S403).

Then, the main controller 103 determines whether the coordinates within the XY plane of the substrate stage 116 at the time of performing exposure with respect to the shot region "i" are included in the non-interference region 301 (Step S404).

When the coordinates within the XY plane of the substrate stage 116 are included in the non-interference region 301 (Yes in Step S404), the main controller 103 stores the i-th shot region as the candidate for the last shot region (Step S405). After that, the process proceeds to Step S406.

Meanwhile, when the coordinates within the XY plane of the substrate stage 116 are not included in the non-interference region 301 (No in Step S404), the main controller 103 advances the process to Step S406 without performing Step S405.

In Step S406, the main controller 103 increments the variable "i" indicating the number of the shot region by 1.

Then, the main controller 103 determines whether the value of the variable "i" is equal to or lower than the value of a number $i_{max}$ of the last shot region (in the example illustrated in FIG. 9A, $i_{max}=32$) (Step S407).

When the value of the variable "i" is equal to or lower than the value of the number $i_{max}$ (Yes in Step S407), the process returns to Step S404.

Meanwhile, when the value of the variable "i" is larger than the value of the number $i_{max}$ (No in Step S407), the determination of Step S404 has been performed for all of the shot regions, and hence the processing is ended.

As described above, in Step S306, the shot region in which the coordinates within the XY plane of the substrate stage 116 at the time of performing exposure are included in the non-interference region 301 is stored as the candidate for the last shot region.

For example, there is considered a case in which exposure is performed with respect to the substrate 115 having a layout of shot regions as illustrated in FIG. 9A in the exposure apparatus 200 having the non-interference region 301 as illustrated in FIG. 10.

At this time, in Step S306, the shot regions 17, 18, 23, 24, 29, 30, and 31 are each stored as the candidate for the last shot region.

Referring back to FIG. 7, after Step S306 is ended, next, the main controller 103 calculates the conveyance time period of the substrate 115 from the coordinates of the exposure position for each shot region stored as the candidate for the last shot region to the coordinates of the substrate carrying-out position 208 (Step S307).

Specifically, in Step S307, a movement time period of the substrate stage 116 from the coordinates of the exposure position for each shot region that is the candidate for the last shot region to the coordinates of the substrate carrying-out position 208 is calculated based on the driving profile information 306 acquired in Step S303.

Next, the main controller 103 selects a shot region corresponding to the shortest movement time period among the movement time periods of the substrate stage 116 calculated for the respective shot regions in Step S307 as a last shot region (Step S308, first determination step). After that, the process proceeds to Step S311.

As described above, when it is determined in Step S305 that the substrate 115 is conveyed by pin conveyance, first, in Step S306, the candidate for the last shot region is extracted from the plurality of shot regions provided in the substrate 115.

Then, in Step S307 and Step S308, a shot region having the shortest conveyance time period of the substrate 115 from the exposure position to the substrate carrying-out position 208 among the shot regions extracted as the candidates for the last shot region is selected as the last shot region.

Referring back to Step S305, when the substrate 115 is not conveyed by pin conveyance when the substrate stage 116 is moved to the substrate carrying-out position 208, that is, when the chuck conveyance is performed (No in Step S305), the process proceeds to Step S309.

In Step S309, the main controller 103 calculates the conveyance time period of the substrate 115 from the coordinates of the exposure position for each of the plurality of shot regions provided in the substrate 115 to the coordinates of the substrate carrying-out position 208.

Specifically, in Step S309, the movement time period of the substrate stage 116 from the coordinates of the exposure position for each shot region to the coordinates of the substrate carrying-out position 208 is calculated based on the driving profile information 306 acquired in Step S303.

Next, the main controller 103 selects a shot region corresponding to the shortest movement time period among the movement time periods of the substrate stage 116 calculated for the respective shot regions in Step S309 as the last shot region (Step S310, first determination step). After that, the process proceeds to Step S311.

For example, there is considered a case in which exposure is performed with respect to the substrate 115 having a layout of shot regions as illustrated in FIG. 9A in the exposure apparatus 200 as illustrated in FIG. 10.

At this time, in Step S310, the shot region 1 in which coordinates of the position of the substrate stage 116 at the time of performing exposure are closest to the coordinates of the substrate carrying-out position 208 is selected as the last shot region.

As described above, when it is determined in Step S305 that the substrate 115 is conveyed by chuck conveyance, a shot region having the shortest conveyance time period of the substrate 115 to the substrate carrying-out position 208 among the plurality of shot regions in the substrate 115 is selected as the last shot region.

That is, when the substrate 115 is conveyed by chuck conveyance, there is no fear of interference between the first substrate conveyance unit 202 and the pins 205 or the reflecting mirror 117 in the substrate stage 116 when the substrate 115 is conveyed from the exposure position to the substrate carrying-out position 208.

Accordingly, unlike the case in which the substrate 115 is conveyed by pin conveyance described above, it is not required to extract the candidate for the last shot region from the plurality of shot regions provided in the substrate 115.

In Step S311, the main controller 103 determines the order of exposure with respect to each of the plurality of shot regions provided in the substrate 115 so that the shot region selected in Step S308 or Step S310 becomes the last shot region (second determination step).

Specifically, in Step S311, the order of the exposure is determined so that, when exposure is performed with respect to each of the plurality of shot regions provided in the substrate 115, the selected shot region becomes the last shot region and the movement time period of the substrate stage 116 is minimized.

Figure 9B:
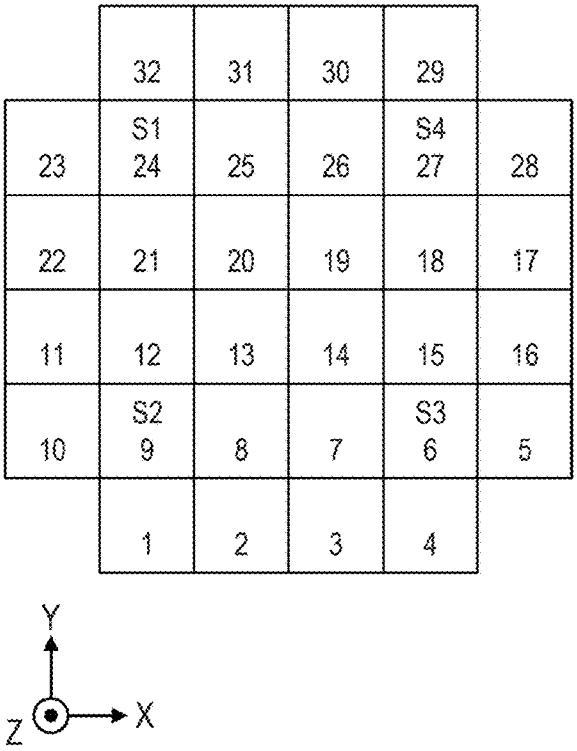
FIG. 9B is a view for illustrating another example of the layout of the plurality of shot regions and the plurality of sample shot regions in the substrate.

FIG. 9B shows an example of a layout of the plurality of shot regions 1 to 32 indicating the order to perform the exposure as numbers, which has been determined in Step S311.

As described above, when it is determined in Step S305 that the substrate 115 is conveyed by chuck conveyance, and the shot region 1 is selected as the last shot region in Step S309 and Step S310, for example, the order of exposure can be determined as illustrated in FIG. 9B.

The order of exposure illustrated in FIG. 9B is merely an example, and may be determined differently based on other rules.

Next, the main controller 103 determines whether the exposure performed with respect to the plurality of shot regions 1 to 32 provided in the substrate 115 is exposure with respect to a layer equal to or larger than the second layer for which processing such as global alignment is performed, in other words, a layer other than the first layer (Step S312).

When the exposure is exposure to the first layer (No in Step S312), the processing is ended.

Meanwhile, when the exposure is exposure to a layer equal to or larger than the second layer (Yes in Step S312), the main controller 103 determines a last sample shot region from the plurality of sample shot regions (Step S313, third determination step).

Specifically, in Step S313, a sample shot region that is closest to the first shot region is selected so that the movement time period of the substrate stage 116 from when the sample shot region is processed to when the exposure with respect to the first shot region is started is minimized.

For example, in the layout of the plurality of shot regions 1 to 32 as illustrated in FIG. 9B, the sample shot region having coordinates closest to the coordinates of the shot region 1 (first shot region) in which the exposure is first performed within the XY plane is the sample shot region S2.

Accordingly, in Step S313, the sample shot region S2 is selected as the last sample shot region.

Next, the main controller 103 determines an order of processing with respect to each of the plurality of sample shot regions provided in the substrate 115 so that the sample shot region selected in Step S313 becomes the last sample shot region (Step S314), and the processing is ended.

Specifically, in Step S314, the order of processing is determined so that the selected sample shot region becomes the last sample shot region and the movement time period of the substrate stage 116 at the time of performing processing with respect to each of the plurality of sample shot regions is minimized.

Figure 9C:
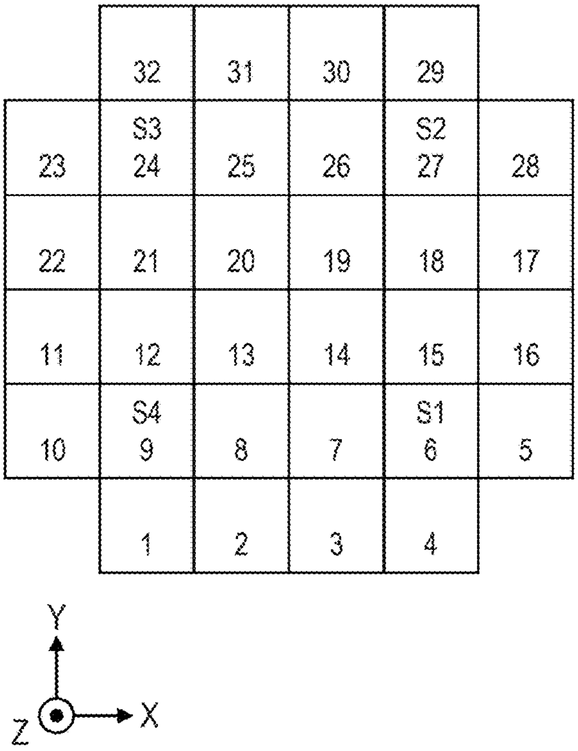
FIG. 9C is a view for illustrating further another example of the layout of the plurality of shot regions and the plurality of sample shot regions in the substrate.

FIG. 9C shows an example of a layout of the plurality of sample shot regions S1 to S4 indicating the order to perform processing as numbers, which has been determined in Step S314.

The order of processing illustrated in FIG. 9C is merely an example, and may be determined differently based on other rules.

As described above, in the information processing apparatus according to the present embodiment, the last shot region in which the exposure is performed last among the plurality of shot regions is determined based on the state of holding the substrate 115 at the time of moving the substrate stage 116 from the exposure position to the substrate carrying-out position 208 in the exposure apparatus 200.

In other words, the last shot region in which the exposure is performed last among the plurality of shot regions is determined based on whether the substrate 115 is conveyed by pin conveyance or chuck conveyance from the exposure position to the substrate carrying-out position 208 in the exposure apparatus 200.

In this manner, the conveyance time period of the substrate 115 from the exposure position to the substrate carrying-out position 208 can be reduced, and thus the throughput can be improved.

Further, in the description above, the exposure apparatus 200 including the information processing apparatus according to the present embodiment is described, but the present invention is not limited thereto. The information processing apparatus according to the present embodiment can be provided also in a pattern forming apparatus for forming a pattern on the substrate, such as an imprint apparatus or a drawing apparatus.

In this case, the imprint apparatus refers to an apparatus in which, after an imprint material supplied on the substrate and a mold are brought into contact with each other, curing energy is applied to the imprint material so that a pattern of a cured product on which a pattern of the mold has been transferred is formed.

Further, the drawing apparatus refers to an apparatus for forming a pattern (latent image pattern) on the substrate by subjecting the substrate to drawing with a charged particle beam (electron beam) or a laser beam.

Further, in the description above, the last shot region in which the exposure is performed last among the plurality of shot regions is determined based on the state of holding the substrate 115 at the time of moving the substrate stage 116 from the exposure position to the substrate carrying-out position 208 in the exposure apparatus 200, but the present invention is not limited thereto.

For example, the order of exposure with respect to the plurality of shot regions may be determined based on the state of holding the substrate 115 in predetermined conveyance which is performed, for example, when the substrate 115 held by the second substrate conveyance unit 204 is passed to the substrate stage 116 at the substrate carrying-in position 207.

According to the present invention, the information processing apparatus capable of improving the throughput in the pattern forming apparatus as compared to the related art can be provided.

[Method of Manufacturing Article]

A method of manufacturing an article according to the present invention includes a step of exposing a substrate such as a wafer or a glass substrate having a photosensitive agent applied thereto with light through use of the exposure apparatus 200 including the information processing apparatus according to the present invention.

Examples of the article include a semiconductor integrated circuit (IC) element, a liquid crystal display element, and micro electro mechanical systems (MEMS).

The method of manufacturing an article according to the present invention further includes a step of developing the exposed substrate (photosensitive agent), and other known steps of processing the developed substrate.

Examples of the other known steps include etching, photosensitive agent removal, dicing, bonding, and packaging.

According to the method of manufacturing an article of the present invention, an article having a higher quality as compared to the related art can be manufactured.

Further, the method of manufacturing an article according to the present invention may use, instead of the exposure apparatus 200, a pattern forming apparatus such as an imprint apparatus or a drawing apparatus.

The exemplary embodiment is described above, but the present invention is not limited to the embodiment and can be modified and changed variously within the scope of the gist thereof.

Further, in the description above, the information processing apparatus according to the present invention has been described, but the information processing method described above, a program for causing a computer to execute the method, and a computer-readable recording medium having the program recorded thereon are also included in the scope of the present invention.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2023-184676, filed Oct. 27, 2023, which is hereby incorporated by reference herein in its entirety.

What is claimed is:

1. An information processing apparatus configured to perform a first determination step of determining, based on a state of holding a substrate by a substrate stage at a time of initiating moving the substrate stage from a pattern forming position to a predetermined position in order to carry out the substrate in a pattern forming apparatus and a layout of a plurality of shot regions on the substrate, a last shot region in which a pattern is the last shot region of the plurality of shot regions to be formed when the pattern is formed in each of the plurality of shot regions, the predetermined position being a position at which the substrate held by the substrate stage is passed to a substrate conveyance unit, wherein the first determination step includes an extraction step of extracting, as a candidate of the last shot region, at least one shot region corresponding to positions included in a non-interference region corresponding to a region of movement start positions of the substrate stage from each of which a mechanical interference between the substrate stage and the substrate conveyance unit is avoided when the substrate stage and the substrate conveyance unit are moved to the predetermined position in parallel to each other, in a case that the holding state indicates that the moving is performed while the substrate is held by a pin provided in the substrate stage.

2. The information processing apparatus according to claim 1, wherein the first determination step includes a step of determining the last shot region so that a time period of performing the moving is minimized.

3. The information processing apparatus according to claim 1, wherein the first determination step includes a step of determining whether the moving is performed while the substrate is held by the pin or the moving is performed while the substrate is held by a chuck provided in the substrate stage.

4. The information processing apparatus according to claim 3, wherein the extraction step includes a step of extracting, when it is determined that the moving is performed while the substrate is held by the pin, from the plurality of shot regions, at least one shot region having the corresponding pattern forming position included in the non-interference region.

5. The information processing apparatus according to claim 4, wherein the extraction step includes a step of determining, for each of the plurality of shot regions, whether the corresponding pattern forming position is included in the non-interference region.

6. The information processing apparatus according to claim 4, wherein the first determination step includes a step of determining, as the last shot region, one of the at least one extracted shot region having a shortest time period of performing the moving.

7. The information processing apparatus according to claim 4, wherein the first determination step includes a step of determining the non-interference region from a movement profile of each of the substrate stage and the substrate conveyance unit.

8. The information processing apparatus according to claim 3, wherein the first determination step includes a step of determining, when it is determined that the moving is performed while the substrate is held by the chuck, one of the plurality of shot regions having a shortest time period of performing the moving as the last shot region.

9. The information processing apparatus according to claim 1, wherein the information processing apparatus is further configured to perform, after the first determination step, a second determination step of determining an order to form the pattern in each of the plurality of shot regions.

10. The information processing apparatus according to claim 9, wherein the information processing apparatus is further configured to perform, when the pattern is formed in a layer other than a first layer for each of the plurality of shot regions, after the second determination step, based on a layout of a plurality of sample shot regions which are provided on the substrate and in which measurement for alignment processing is performed, a third determination step of determining a last sample shot region in which the measurement is performed last when the measurement is performed in each of the plurality of sample shot regions.

11. The information processing apparatus according to claim 10, wherein the third determination step includes a step of determining, as the last sample shot region, one of the plurality of sample shot regions closest to a first shot region in which the pattern is formed first.

12. The information processing apparatus according to claim 10, wherein the information processing apparatus is further configured to perform, after the third determination step, a step of determining an order to perform the measurement with respect to the plurality of sample shot regions.

13. A pattern forming apparatus for forming a pattern on a substrate, the pattern forming apparatus comprising:

a substrate stage configured to hold the substrate when the pattern is formed on the substrate;

a substrate conveyance unit configured to convey the substrate;

the information processing apparatus of claim 1; and a controller configured to control movement of each of the substrate stage and the substrate conveyance unit.

14. The pattern forming apparatus according to claim 13, wherein the substrate stage includes a chuck configured to hold the substrate when the pattern is formed on the substrate, and a pin configured to hold the substrate when the substrate is passed to the substrate conveyance unit, and wherein the controller is configured to perform a step of selecting one of first conveyance or second conveyance, the first conveyance causing both of the substrate stage and the substrate conveyance unit to move in parallel to each other to a predetermined position at which the substrate is passed from the substrate stage to the substrate conveyance unit while the substrate is held by the pin, the second conveyance causing the substrate stage to move to the predetermined position while the substrate is held by the chuck and then causing the substrate conveyance unit to move to the predetermined position.

15. An information processing method comprising a first determination step of determining, based on a state of holding a substrate by a substrate stage at a time of initiating moving the substrate stage from a pattern forming position to a predetermined position in order to carry out the substrate in a pattern forming apparatus and a layout of a plurality of shot regions on the substrate, a last shot region in which a pattern is the last shot region of the plurality of shot regions to be formed when the pattern is formed in each of the plurality of shot regions, the predetermined position being a position at which the substrate held by the substrate stage is passed to a substrate conveyance unit, wherein the first determination step includes an extraction step of extracting, as a candidate of the last shot region, at least one shot region corresponding to positions included in a non-interference region corresponding to a region of movement start positions of the substrate stage from each of which a mechanical interference between the substrate stage and the substrate conveyance unit is avoided when the substrate stage and the substrate conveyance unit are moved to the predetermined position in parallel to each other, in a case that the holding state indicates that the moving is performed while the substrate is held by a pin provided in the substrate stage.

16. The information processing method according to claim 15, further comprising a second determination step of determining an order to form the pattern in each of the plurality of shot regions, the second determination step being performed after the first determination step.

17. A method of manufacturing an article, the method comprising:

forming the pattern in each of the plurality of shot regions in an order determined in accordance with the information processing method of claim 15; and manufacturing an article by processing a predetermined shot region in which the pattern is formed.

18. A non-transitory computer-readable recording medium having recorded thereon a program for causing a computer to execute a first determination step of determining, based on a state of holding a substrate by a substrate stage at a time of initiating moving the substrate stage from a pattern forming position to a predetermined position in order to carry out the substrate in a pattern forming apparatus and a layout of a plurality of shot regions on the substrate, a last shot region in which a pattern is the last shot region of the plurality of shot regions to be formed when the pattern is formed in each of the plurality of shot regions, the predetermined position being a position at which the substrate held by the substrate stage is passed to a substrate conveyance unit, wherein the first determination step includes an extraction step of extracting, as a candidate of the last shot region, at least one shot region corresponding to positions included in a non-interference region corresponding to a region of movement start positions of the substrate stage from each of which a mechanical interference between the substrate stage and the substrate conveyance unit is avoided when the substrate stage and the substrate conveyance unit are moved to the predetermined position in parallel to each other, in a case that the holding state indicates that the moving is performed while the substrate is held by a pin provided in the substrate stage.

* * * * *